(12) United States Patent
Lu et al.

(10) Patent No.: US 7,349,218 B2
(45) Date of Patent: Mar. 25, 2008

(54) LOCKING DEVICE FOR A HEAT SINK

(75) Inventors: Cui-Jun Lu, Shenzhen (CN); Yong Zhong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 145 days.

(21) Appl. No.: 11/308,626

(22) Filed: Apr. 13, 2006

(65) Prior Publication Data
US 2007/0242439 A1     Oct. 18, 2007

(51) Int. Cl.
*H05K 7/20* (2006.01)

(52) U.S. Cl. ............... 361/719; 361/684; 361/687; 361/695; 361/702; 361/704; 361/719; 257/718; 257/719; 257/E23.084; 174/16.3; 165/80.3; 165/185; 24/453

(58) Field of Classification Search ............... 361/684, 361/687, 695, 704, 702, 719; 257/718–719, 257/E23.084; 165/80.3, 185; 174/16.3; 24/453, 457–458
See application file for complete search history.

(56) References Cited

U.S. PATENT DOCUMENTS

| | | | |
|---|---|---|---|
| 6,307,748 B1 * | 10/2001 | Lin et al. | 361/704 |
| 6,456,490 B1 * | 9/2002 | Lai | 361/684 |
| 6,514,023 B2 * | 2/2003 | Moerke | 411/45 |
| 6,752,577 B2 | 6/2004 | Teng | |
| 6,859,367 B2 | 2/2005 | Davidson | |
| 6,934,155 B2 * | 8/2005 | Aoki et al. | 361/704 |
| 7,126,823 B2 * | 10/2006 | Chen et al. | 361/702 |
| 7,161,808 B2 * | 1/2007 | Atkinson | 361/719 |
| 7,164,583 B2 * | 1/2007 | Lee et al. | 361/704 |
| 7,262,969 B2 * | 8/2007 | Lee et al. | 361/704 |
| 2004/0047130 A1 * | 3/2004 | Liu | 361/704 |
| 2005/0201064 A1 * | 9/2005 | Chen et al. | 361/719 |

* cited by examiner

*Primary Examiner*—Gandhi N Jayprakash
*Assistant Examiner*—Courtney L Smith
(74) *Attorney, Agent, or Firm*—Jeffrey T. Knapp

(57) ABSTRACT

A locking device is for locking a heat sink to an electronic device. The locking device includes a retaining frame and a guiding member positioned on the retaining frame. The guiding member includes a seat having a base sitting on the retaining frame, a sleeve extending upwardly from the seat, and two spaced legs descending from the base of the seat to retain the guiding member to the retaining frame. A fastener is accommodated in the sleeve of the guiding member and is kept vertical to the retaining frame by the guiding member.

13 Claims, 5 Drawing Sheets

LOCKING DEVICE FOR A HEAT SINK

FIELD OF THE INVENTION

The present invention relates generally to a locking device, and more particularly to a locking device for securing a heat sink to an electronic device.

DESCRIPTION OF RELATED ART

It is well known that electronic devices generates large amounts of heat during operation thereof. The more rapidly the electronic devices operate, the more heat they generate. If the heat is not dissipated duly, the stability of the operation of the electronic devices will be impacted severely. Generally, in order to ensure the electronic device to run normally, a heat sink is used to dissipate the heat generated by the electronic device. And in order to keep the heat sink intimately contacting the electronic device, a locking device is usually desired to secure the heat sink to the electronic device.

Conventionally, a locking device comprises a plurality of screws for fastening a heat sink to a printed circuit board. The screws are fitted in corresponding fixing holes defined in a base of the heat sink or a locking frame attached to the heat sink and corresponding fixing apertures defined in a back plate attached a bottom face of the printed circuit board, to thereby keep the heat sink contacting electronic device to dissipate heat generated by the electronic device. However, in assembly of the screws to the back plate, a screw driver is desired to drive the screws, which have been extended through the fixing holes of the base or the fixing frame, to be locked in the fixing apertures of the back plate. Usually, a force provided by the driver on the screw is difficult to be kept in a vertical direction to the screw, and thus, the screw can not aim at the fixing holes and the fixing apertures correctly. As a result, a problem that the back plate is damaged because of an unaligned force from the screw may occur. Such a problem can cause a breakage of the back plate.

What is needed, therefore, is a locking device which fastens a heat sink to a printed circuit board safely.

SUMMARY OF INVENTION

A locking device in accordance with an embodiment of the present invention is for locking a heat sink to an electronic device. The locking device comprises a retaining frame defining a fixing hole therein and a guiding member positioned on the retaining frame. The guiding member comprises a seat having a base sitting on the retaining frame, a sleeve extending from the seat, and two spaced legs descending from the base of the seat in a direction opposite to the sleeve to retain the guiding member to the retaining frame. The base of the seat of the guiding member defines an opening therein. The sleeve defines a room communicating with the opening of the base of the seat. A fastener is accommodated in the room of the sleeve of the guiding member. The guiding member keeps the fastener vertical to the retaining frame and aiming at the fixing hole of the retaining frame.

Other advantages and novel features will become more apparent from the following detailed description of preferred embodiments when taken in conjunction with the accompanying drawings, in which:

DETAILED DESCRIPTION

Figure 1:
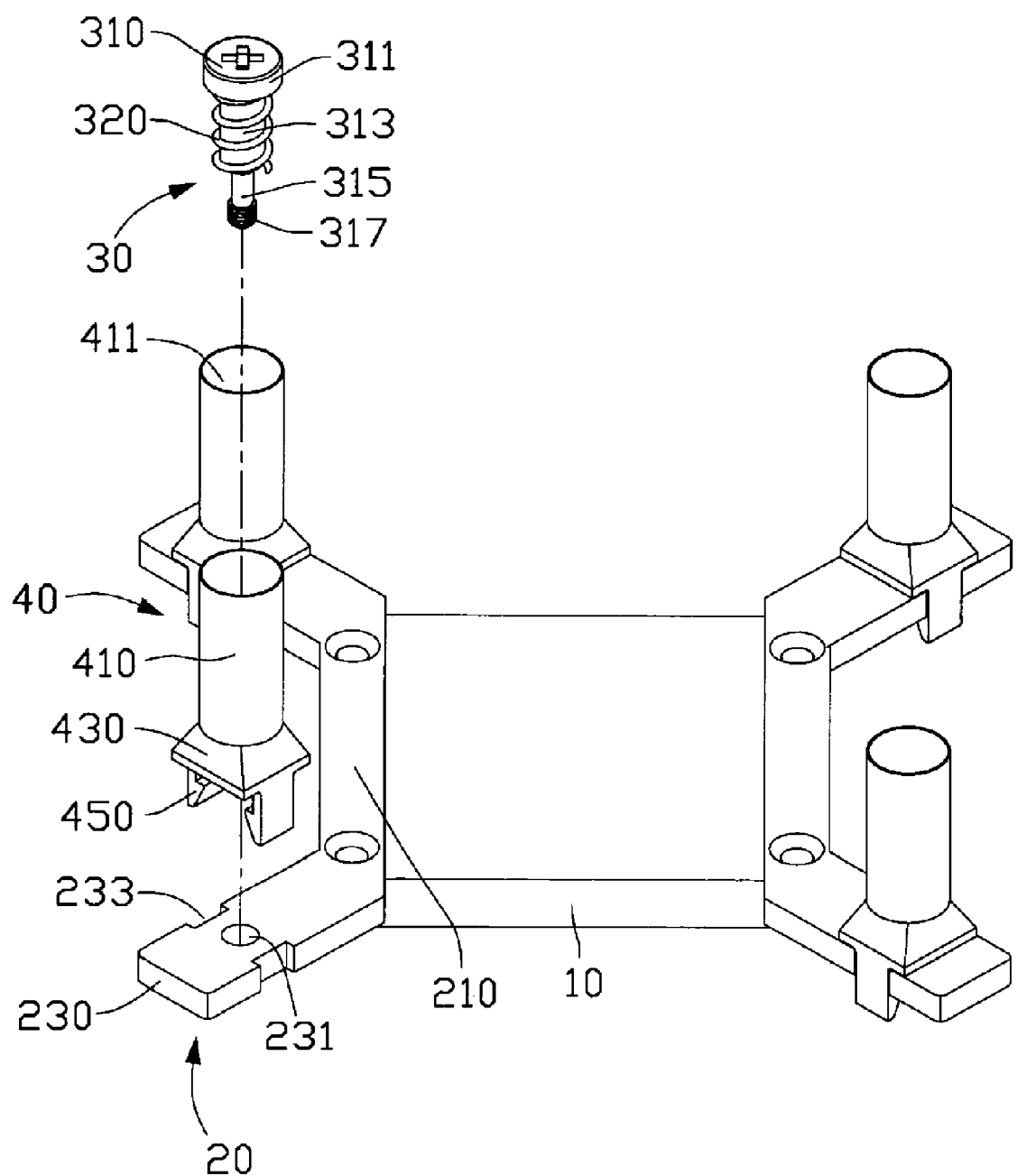
FIG. 1 is an exploded, isometric view of a locking device with relevant components in accordance with a preferred embodiment of the present invention.

Referring to FIG. 1, in accordance with a preferred embodiment of the present invention, a locking device is used for securing a heat sink (not shown) to an electronic device (not shown) such as a central processing unit (CPU) located atop a printed circuit board (not shown). The locking device comprises a base plate 10 and two retaining frames 20 integral to two opposite sides of the base plate 10, respectively. The base plate 10 has a bottom face (not labeled) for intimately and thermally contacting with the electronic device and a top face (not labeled) for thermally and mechanically connecting with the heat sink. The locking device further includes a plurality of fasteners 30 for retaining the heat sink to the printed circuit board, and a plurality of guiding members 40 for guiding the fasteners 30 fitted in the frames 20 to correctly extend through the printed circuit board and screw with a back plate (not shown) at a bottom of the printed circuit board thereby to mount the heat sink on the printed circuit board.

Each of the two retaining frames 20 is substantially C-shaped in profile, and comprises a main body 210 integral to the base plate 10, and two retaining arms 230 extending away the base plate 10 from two ends of the main body 210, respectively. Each retaining arm 230 defines a fixing hole 231 adjacent to a distal end thereof. Two positioning cutouts 233 are defined by the retaining arm 230 at two opposite sides of the fixing hole 231, for positioning the guiding member 40 on the retaining arm 230.

Each fastener 30 comprises a bolt 310 and a spring coil 320 surrounding the bolt 310. The bolt 310 comprises a shaft 313, an expanded head 311 and a slim engaging portion 315 extending from two ends of the shaft 313, respectively. A cross-shaped groove (not labeled) is defined in a top face of the head 311 for fitting with a screw driver (not shown). A threading portion 317 is formed at a bottom end of the engaging portion 315. The spring coil 320 surrounds the shaft 313 under the head 311 of the bolt 310.

Figure 2:
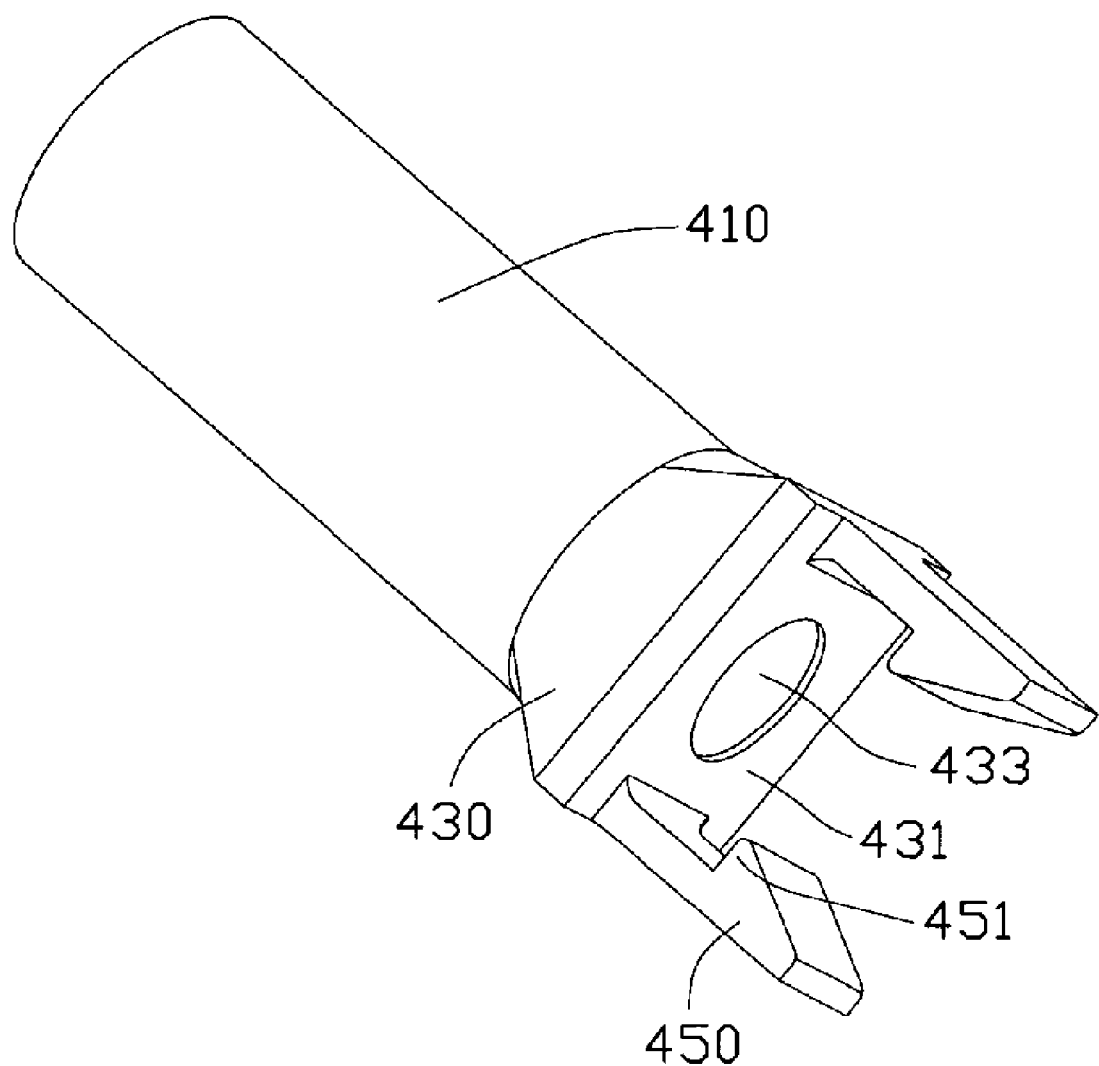
FIG. 2 shows a guiding member of the locking device of FIG. 1.
Figure 3:
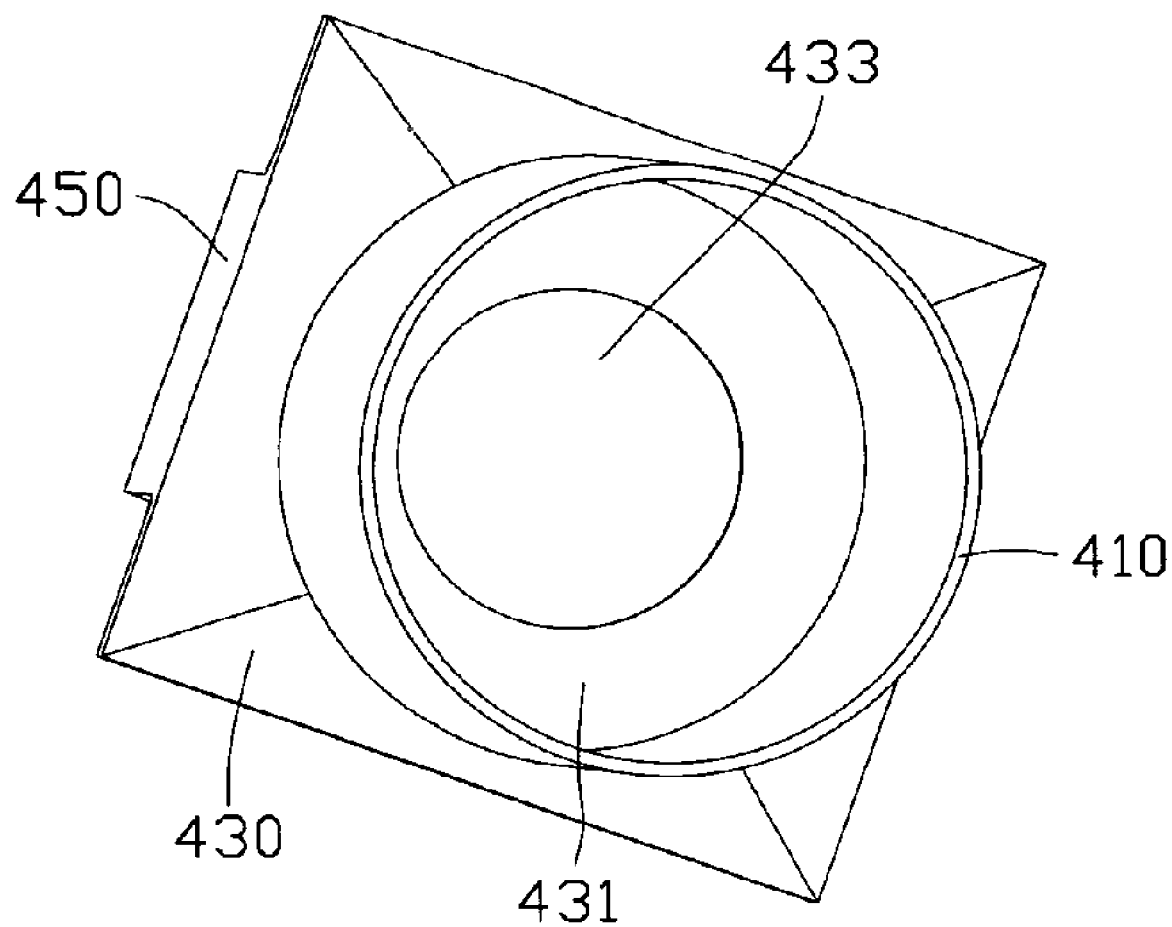
FIG. 3 shows the guiding member of FIG. 2 but in a different aspect.

Referring also to FIGS. 2 and 3, each guiding member 40 comprises a seat 430, a cylindrical sleeve 410 extending upwardly from the seat 430, and two spaced positioning legs 450 opposite to the sleeve 410 and descending from two opposite sides of the seat 430, respectively. The seat 430 is substantial a frustum of a prism, comprises a base 431 at a bottom thereof, and four interconnecting sidewalls (not labeled) extending from the base 431 toward the sleeve 410. The base 431 defines an opening 433 in a center thereof. The sleeve 410 surrounds a cylindrical room 411 communicating with the opening 433 of the base 431. An inner diameter of the sleeve 410 is larger than a diameter of the head 311 of the bolt 310 of the fastener 30. The two legs 450 form two barbs 451 face to face at distal ends thereof. A diameter of the opening 433 of the base 431 is larger than that of the engaging portion 315, but is smaller than that of the shaft 313 of the bolt 310 of the fastener 30.

Figure 4:
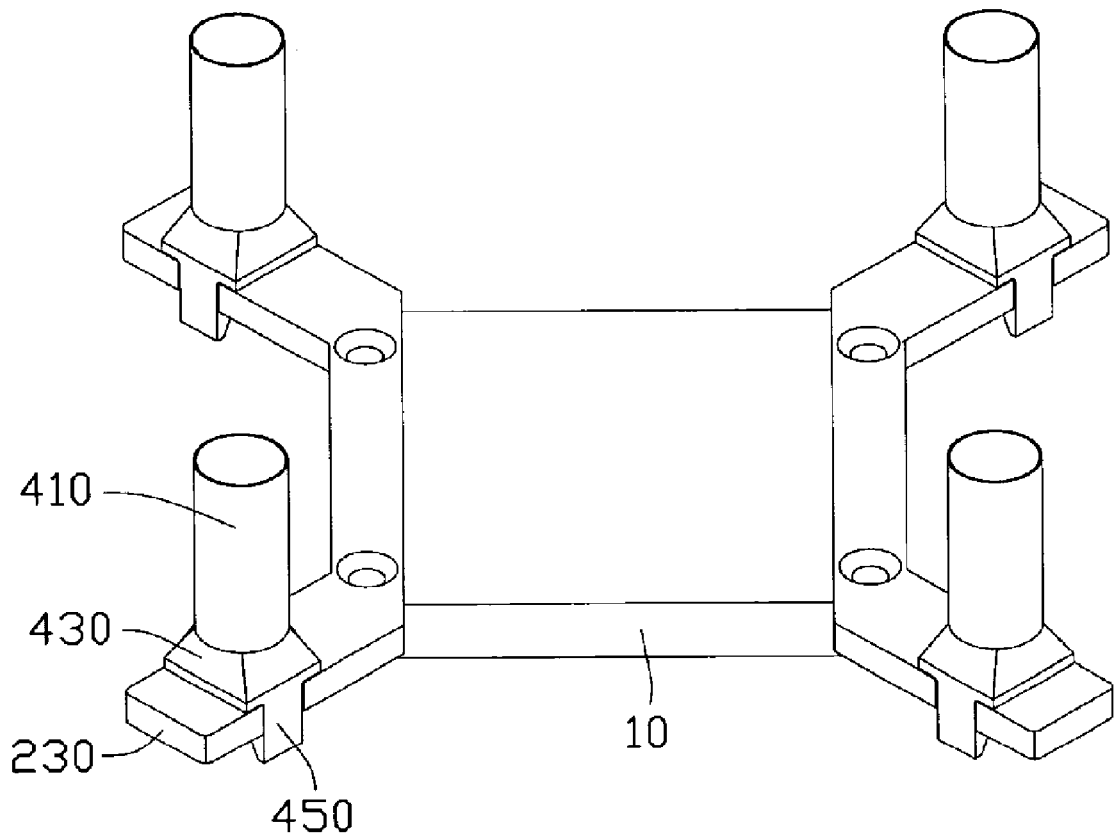
FIG. 4 is an assembled view of FIG. 1.
Figure 5:
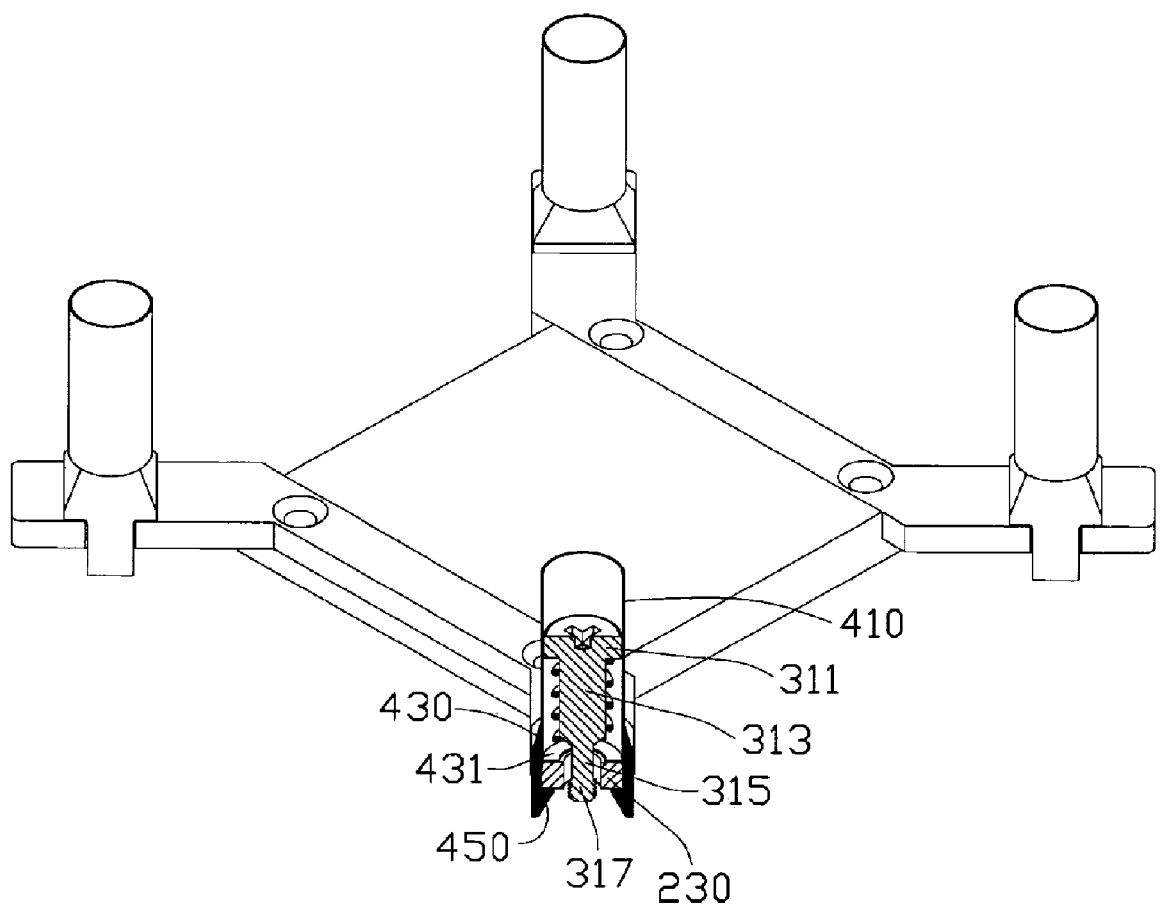
FIG. 5 is a view similar to FIG. 4 with a part thereof being cut away for clarity.

Referring to FIGS. 4 and 5, in assembly, each guiding member 40 is positioned on a corresponding fixing arm 230 of the frame 20 via the two legs 450 thereof being positioned in the cutouts 233 of the fixing arm 230 and clasping the fixing arm 230 therebetween. The base 431 of the guiding member 40 sits on a top face of the fixing arm 230. The barbs 451 of the legs 450 abut against a bottom face of the fixing arm 230. Therefore, the guiding member 40 is vertically positioned on the fixing arm 230. The opening 433 of the base 431 of the seat 430 is in alignment with the fixing hole 231 of the fixing arm 230. Each fastener 30 is accommodated in the sleeve 410 of a corresponding guiding member 40, and is coaxial with the sleeve 410. The threading portion 317 of the bolt 310 of the fastener 30 extends through the opening 433 of the base 431 of the guiding member 40 and the fixing hole 231 of the fixing arm 230 of the frame 20. Under the drive of the screw driver, which is electrically or pneumatically powered, the threading portion 317 extending through the printed circuit board and threadedly engage in a threaded hole of the back plate at the bottom of the printed circuit board. The spring coil 320 presses the retaining frame 20 toward the printed circuit board. Therefore, the heat sink is retained on the electronic device.

According to the embodiment of the present invention, the guiding members 40 of the locking device are vertically positioned on the fixing arms 230 of the frame 20 to thereby keep the fasteners 30 in the guiding member 40 vertical to the printed circuit board and the back plate. Therefore, under the drive of the screw driver, the engaging portions 315 of the bolts 310 of the fasteners 30 correctly aim at and vertically extend through apertures of the printed circuit board, which avoids damage to the printed circuit board during the screwing of the threading portions 317 in the threaded holes of the back plate. Furthermore, the threading portions 317 can be always maintained in a vertical orientation to correctly threadedly engaging with the back plate, whereby a damage to the back plate due to the screw in of the threading portions 317 of the bolts 310 can be avoided.

Additionally, the guiding member 40 has the base 431 resting on the fixing arm 230 of the frame 20, which avoids abrasion between the spring coil 320 of the fastener 30 and the fixing arm 230 when the fastener 30 is fixed to the back plate. Since the spring coil 320 and the fixing arm 230 both are made of metal, the abrasion therebetween may produce metal debris which when falling onto the printed circuit board can cause a short circuit of the printed circuit board. The guiding member 40 is made of plastics, and an abrasion between it and the spring coil 320 will not produce any metal debris.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A locking device for locking a heat sink to an electronic device, the locking device comprising:
   a retaining frame defining a fixing hole and the retaining frame further comprising a pair of cutouts therein;
   a guiding member being positioned on the retaining frame, the guiding member comprising a seat sitting on the retaining frame, a sleeve extending from the seat, and a positioning portion descending from the seat and engaging with the retaining frame thereby retaining the guiding member to the retaining frame, the positioning portion further comprising two spaced legs extending from the seat, each respective cutout being at a corresponding opposite side of the fixing hole, each leg being fitted in a respective cutout; and
   a fastener being accommodated in the sleeve of the guiding member;
   wherein the guiding member keeps the fastener vertical to the retaining frame and aiming at the fixing hole of the retaining frame.

2. The locking device of claim 1, wherein the seat of the guiding member comprises a base sitting on the frame, the base having an opening defined in alignment with the fixing hole of the frame, the fastener being fitted in the opening and the fixing hole.

3. The locking device of claim 2, wherein the seat of the guiding member is substantial a frustum of a prism, and comprises four interconnecting sidewalls extending upwardly from the base thereof.

4. The locking device of claim 2, wherein two spaced legs extend from the base of the seat of the guiding member, each of the two legs forming a barb at a distal end thereof.

5. The locking device of claim 4, wherein the barbs of the legs of the guiding member abut against a bottom face of the frame.

6. The locking device of claim 4, wherein the fastener of comprises a bolt and a spring coil surrounding the bolt of the fastener.

7. The locking device of claim 6, wherein the bolt of comprises a shaft, an expanding head and a slim engaging portion extending from top and bottom ends of the shaft, respectively.

8. The locking device of claim 7, wherein a thread portion is formed at a bottom end of the engaging portion of the bolt of the fastener and extending through the opening of the base of the seat of the guiding member and the fixing hole of the frame.

9. The locking device of claim 8, wherein the spring coil surrounds the shaft of bolt of the fastener and rests on the base of the seat of the guiding member.

10. The locking device of claim 1, wherein the sleeve of guiding member is substantially cylindrical, and the guiding member is made of plastics.

11. A locking device for locking a heat sink to a printed circuit board on which a heat-generating electronic device is mounted, comprising:
   a base plate having a top face adapted for thermally and mechanically connecting with the heat sink and a bottom face adapted for thermally connecting with the electronic device;
   a pair of retaining frames integral to two sides of the base plate, respectively, each retaining frame defining two fixing holes in two opposite ends thereof, respectively;
   at least one guiding member being vertically attached on a corresponding one of the two opposite ends of a respective retaining frame, each guiding member comprising a base on a top face of a corresponding end of the respective retaining frame, the corresponding end of the respective retaining frame defining a cutout in a side thereof, and the leg fits in the cutout and has a barb engaging a bottom face of the corresponding end of the respective retaining frame; and at least one fastener received in a respective sleeve, each fastener having a bolt with a head adapted for fitting with a screw driver, a shaft extending downwardly from the head, and an engaging portion extending downwardly from the shaft, the engaging portion having a diameter smaller than that of the shaft and having a threading portion for extending through the base and a corresponding fixing hole in the corresponding end of the respective retaining frame.

12. The locking device of claim 11, wherein the fastener further comprises a coil spring surrounding the shaft between the head and the base, and wherein the guiding member is made of plastics.

13. The locking device of claim 11, wherein the guiding member further comprises a seat interconnecting the base and the sleeve, the seat has a configuration tapering from the base toward the sleeve.

* * * * *